(12) United States Patent  
Balram et al.

(10) Patent No.: US 8,829,633 B2  
(45) Date of Patent: Sep. 9, 2014

(54) SELF-ALIGNED SEMICONDUCTOR RIDGES IN METALLIC SLITS AS A PLATFORM FOR PLANAR TUNABLE NANOSCALE RESONANT PHOTODETECTORS

(71) Applicant: The Board of Trustees of the Leland Stanford Junior University, Palo Alto, CA (US)

(72) Inventors: Krishna Coimbatore Balram, Stanford, CA (US); David A. B. Miller, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 13/886,998

(22) Filed: May 3, 2013

(65) Prior Publication Data

US 2013/0292788 A1    Nov. 7, 2013

Related U.S. Application Data

(60) Provisional application No. 61/642,283, filed on May 3, 2012.

(51) Int. Cl.  
*H01L 31/0232*    (2014.01)

(52) U.S. Cl.  
USPC ............ 257/432; 257/431; 257/457; 257/488

(58) Field of Classification Search  
USPC ................ 257/185, 437, 457, 488, 431–432; 385/12, 14  
See application file for complete search history.

(56) References Cited

U.S. PATENT DOCUMENTS

| | | | |
|---|---|---|---|
| 5,227,648 A | 7/1993 | Woo | |
| 5,631,490 A | 5/1997 | Dutta et al. | |
| 7,129,469 B2 * | 10/2006 | Mochizuki et al. | ........... 250/226 |
| 7,423,254 B2 | 9/2008 | Arend et al. | |
| 7,629,663 B2 | 12/2009 | Pardo et al. | |
| 7,693,363 B2 | 4/2010 | Dionne et al. | |
| 8,290,325 B2 * | 10/2012 | Reshotko et al. | ............. 385/129 |
| 2011/0075962 A1 | 3/2011 | Block | |
| 2011/0156189 A1 | 6/2011 | Gravrand et al. | |
| 2012/0006981 A1 | 1/2012 | Van Dorpe et al. | |

* cited by examiner

*Primary Examiner* — Dung A. Le  
(74) *Attorney, Agent, or Firm* — Lumen Patent Firm (57) ABSTRACT

A photodetector having a ridge-in-slit geometry is provided, where a semiconductor ridge is laterally sandwiched in a metallic slit. This assembly is disposed on a layer of semiconducting material, which in turn is disposed on an insulating substrate. These structures can provide efficient resonant detectors having the wavelength of peak response set by the ridge width. Thus a lateral feature defines the wavelength of peak responsivity, as opposed to a vertical feature.

14 Claims, 8 Drawing Sheets

SELF-ALIGNED SEMICONDUCTOR RIDGES IN METALLIC SLITS AS A PLATFORM FOR PLANAR TUNABLE NANOSCALE RESONANT PHOTODETECTORS

CROSS REFERENCE TO RELATED APPLICATIONS

This application claims the benefit of U.S. provisional patent application 61/642,283, filed on May 3, 2012, and hereby incorporated by reference in its entirety.

GOVERNMENT SPONSORSHIP

This invention was made with Government support under contract number FA9550-09-1-0704 awarded by the Air Force Office of Scientific Research. The Government has certain rights in this invention.

FIELD OF THE INVENTION

This invention relates to photodetectors.

BACKGROUND

Small photodetectors that are efficient, that can if necessary be tuned for spectral response in specific wavelength regions of interest, and that are compatible with the processing technologies and structures of modern silicon CMOS electronics manufacture are very important for many application areas. Such areas include compact on-chip spectrometers for lab-on-chip type systems, detectors for free-space wavelength division multiplexing (WDM) systems and multi-spectral imaging detectors.

It is particularly useful in manufacture also that such photodetectors could operate with very thin layers of absorbing materials since thin layers of, for example, silicon semiconductor absorbing material, are compatible with modern silicon manufacture. However, previous approaches to either tunability of spectral response or to the use of only thin layers of absorbing material, have required vertical cavities that require different thicknesses for different spectral responses or horizontal cavities that are necessarily at least several wavelengths in size, making them less desirable for dense photodetector arrays for cameras or for coupling to very small light beams.

For example, in U.S. Pat. No. 5,227,648 a photodiode array having sharp and distinct resonances for each detector element is considered. However, the approach for providing this capability is the formation of vertical resonant cavities using layers with variable thickness across the wafer, which is difficult fabrication in its own right, and which also poses formidable integration difficulties with more conventional processing technology.

SUMMARY

Here we solve these problems, avoiding the necessity of different thicknesses of resonator for different wavelength responses, and enabling photodetectors that can still be highly sensitive in detecting incoming light even when using only thin layers of relatively weakly absorbing material. Importantly, our device allows multiple different wavelength sensitivities of detectors to be made all in one substantially planar process in which the layer thicknesses are the same for all the different wavelength sensitivities. Such planar processes with substantially identical layer thicknesses for different devices are highly advantageous for manufacture.

The basic approach is a ridge-in-slit geometry, where a semiconductor ridge is laterally sandwiched in a metallic slit. This assembly is disposed on a layer of semiconducting material, which in turn is disposed on an insulating substrate. These structures can provide efficient resonant detectors having the wavelength of peak response set by the ridge width. Thus a lateral feature defines the wavelength of peak responsivity, as opposed to a vertical feature.

This device can absorb light much more efficiently than a similarly thick layer of semiconductor without the ridge structure as described herein. Hence the present approach is attractive for applications, such as optical interconnects or an infra-red camera, in which efficient photodetection is required even when using only a thin layer of semiconductor. For example, this geometry allows efficient silicon detectors to be designed for data communication applications at 850 nm, which is a wavelength at which silicon is weakly absorbing.

DETAILED DESCRIPTION

In this description, section A provides a discussion of general principles, and section B relates to a specific experimental example.

A) General Principles

Figure 1A:
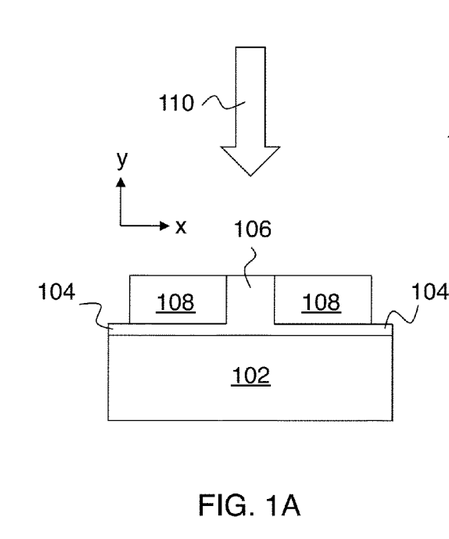
FIGS. 1A-B show two views of an exemplary embodiment of the invention.
Figure 1B:
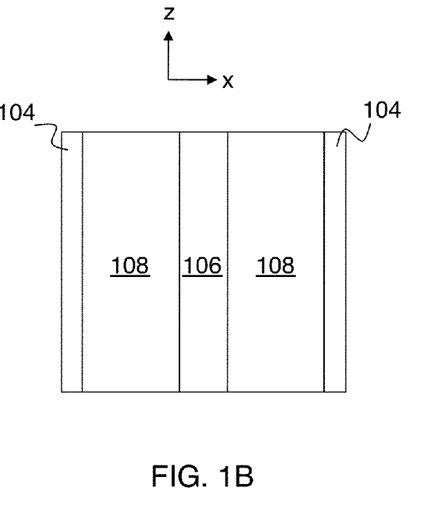
Figure 1C:
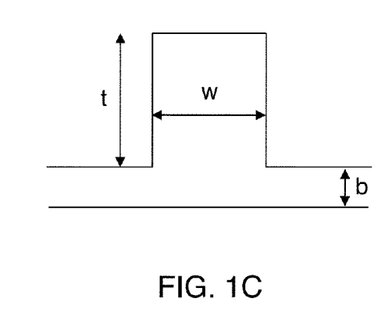
FIG. 1C shows an enlarged view of the ridge in FIG. 1A.

FIGS. 1A-B show two views of an exemplary embodiment of the invention. In this example, an insulating substrate 102 has a semiconducting layer 104 disposed on top of it. A semiconducting ridge 106 is disposed on semiconducting layer 104 and is laterally sandwiched between metal terminals 108 (which are also disposed on semiconducting layer 104). FIG. 1A shows a side view of this structure, and FIG. 1B shows a corresponding top view. Optical illumination from above is schematically shown by arrow 110 on FIG. 1A. Optical illumination of semiconducting ridge 106 provides an electrical detector response at terminals 108. FIG. 1C shows an enlarged view of the ridge in FIG. 1A. Here w is the ridge width, t is the ridge thickness, and b is the layer thickness.

The dimensions shown on FIG. 1C are significant in practicing the invention. Preferably, w is about $2.5 \lambda_p/n_s$, where $\lambda_p$ is a desired wavelength of peak response (i.e., a design input) and $n_s$ is the index of refraction of the semiconducting ridge at $\lambda_p$. More precisely, the relevant mode index can be used for $n_s$ and reflection phase shifts can be accounted for in selecting the ridge width to ensure that the 5/2 wavelength resonance of the structure is at $\lambda_p$. In practice, this optimization will usually give a value for w of about 2.5 $\lambda_p/n_s \pm 10\%$. A suitable thickness b is about 50 nm. If b is too small, collection of photocurrent is impaired, thereby undesirably reducing detector efficiency. If b is too large, then the quality factor of the device is reduced as the base layer acts as an additional optical loss channel. Device simulations according to these principles can be employed to optimize the thickness b. The preferred ridge thickness t has been found via simulation to depend on the design wavelength $\lambda_p$. The thickness is usually chosen to optimize the absorption for a given center wavelength $\lambda_p$ and one can then tune the resonant wavelength of the device around this center wavelength by varying the width of the ridge. This optimized thickness t is usually less than the design wavelength $\lambda_p$.

As indicated above, a significant feature of this approach is that the free space wavelength of peak detector response (i.e., $\lambda_p$) is determined by the ridge width. Another significant, and surprising, feature of the present approach is that the ridge width w can be less than $\lambda_p$. For example, if the above-preferred ridge width is used, then w will be less than $\lambda_p$ if $n_s$ is greater than 2.5, which is often the case for materials of practical interest, such as silicon, germanium etc.

The incident optical radiation can be polarized parallel to the ridge (i.e., electric field mainly in the z direction on FIGS. 1A-B) or perpendicular to the ridge (i.e., magnetic field mainly in the z direction on FIGS. 1A-B)

In some embodiments, the detector response is a photoconductive response. The example of FIGS. 1A-B is one such embodiment. Here layer 104 and ridge 106 can have the same doping and composition, which simplifies fabrication. In operation, an electrical bias is applied between terminals 108, and the detector response is a photocurrent between these terminals due to generation of charge carriers in ridge 106 and layer 104.

Figure 2:
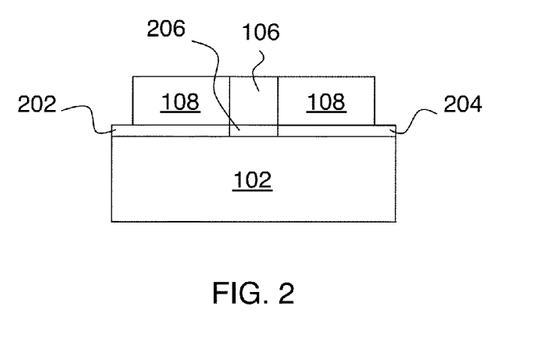
FIG. 2 shows an alternative embodiment of the invention.

In other embodiments, the detector response is a photovoltaic response. FIG. 2 shows an example of this approach. Here ridge 106 is intrinsic, and the semiconducting layer includes an intrinsic region 206, n-doped region 202 and p-doped region 204. Here regions 106 and 206 are shown as separate regions for consistency of description, but in practice these two regions can actually be a single region having the same doping and composition.

Figure 3A:
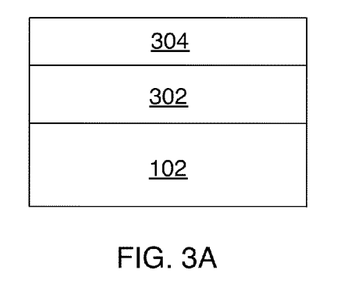
FIGS. 3A-E show an exemplary fabrication sequence.
Figure 3B:
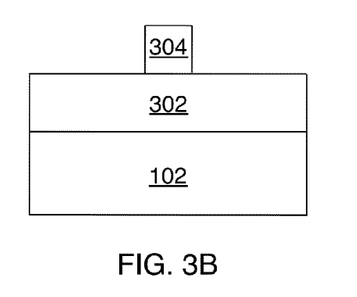
Figure 3C:
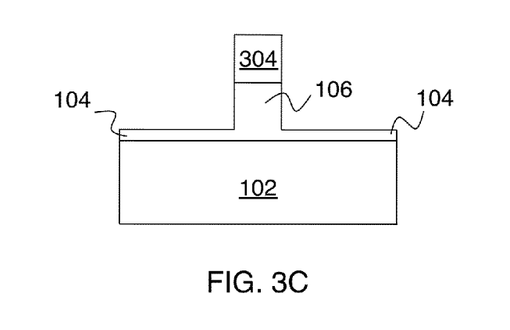
Figure 3D:
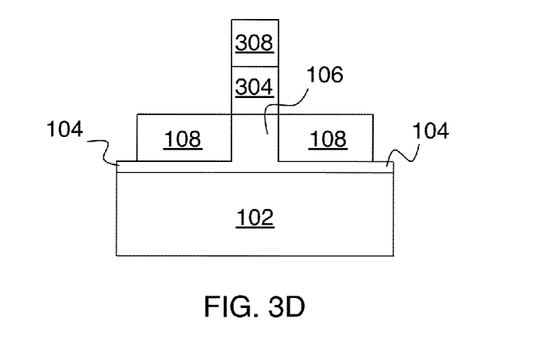
Figure 3E:
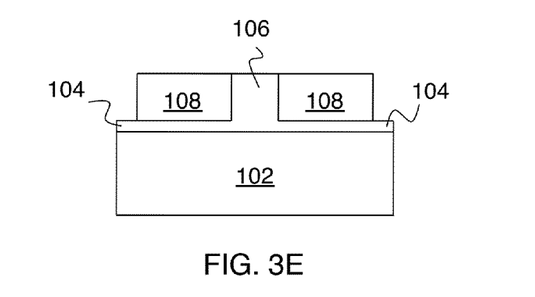

FIGS. 3A-E show an exemplary fabrication sequence. Here FIG. 3A shows a starting point with a substrate 102, a silicon layer 302, and a top oxide layer 304. The combination of layers 102 and 302 can be the top two layers of a silicon on insulator (SOI) wafer, where substrate 102 is the buried oxide layer. In such a case, top oxide 304 can be provided by oxidizing the top surface of silicon layer 302. FIG. 3B shows the result of defining the ridge pattern by etching top oxide 304. FIG. 3C shows the result of performing a silicon etch to form the ridge pattern. Here the semiconducting ridge 106 and semiconducting layer 104 are defined. FIG. 3D shows the result of applying metal to the structure of FIG. 3C. Here terminals 108 are defined, and metal 308 on top oxide 304 is also present. FIG. 3E shows the result of an oxide lift-off applied to the structure of FIG. 3D. As can be seen, the resulting structure is as also shown on FIG. 1A and discussed above.

As indicated above, the wavelength of peak spectral response of these detectors is set by the ridge width. Conventional detectors tend to have spectral response curves which are not sharply peaked (i.e., they are not resonant), and which are primarily determined by the materials used in the detector. The ability to adjust the center wavelength of a sharply peaked detector spectral response is in sharp contrast to conventional detector capabilities.

Figure 4:
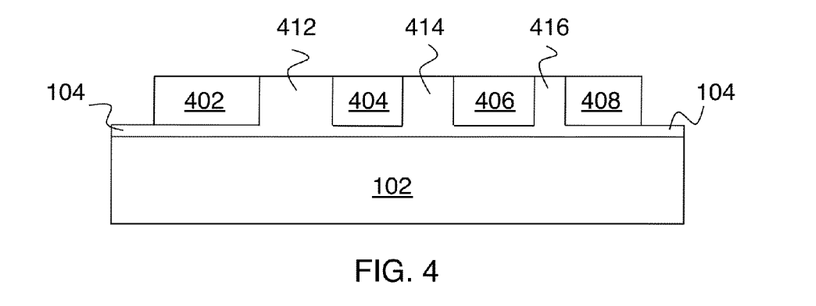
FIG. 4 shows an embodiment of the invention having an electrically adjustable spectral detector response.

This capability can be exploited to provide a significant degree of electrical tunability of a detector response curve. FIG. 4 shows an example. Here ridges 412, 414 and 416 have different widths, and therefore have different wavelengths of peak response. Individual electrical biases can be applied to each ridge. Here the bias between terminals 402 and 404 relates to ridge 412, the bias between terminals 404 and 406 relates to ridge 414, and the bias between terminals 406 and 408 relates to ridge 416. The total photocurrent is the sum of the contributions from each ridge (since all ridges are connected via layer 104). The contribution of each ridge to the total photocurrent depends on its bias. Thus, the spectral response curve of this device can be electrically tuned by altering these biases.

For example, if ridge 412 is biased but there is no bias for ridges 414 and 416, the overall spectral response will be the spectral response of ridge 412. If ridge 416 is biased but there is no bias for ridges 412 and 414, the overall spectral response will be the spectral response of ridge 416. More generally, analog combinations of the spectral responses of the three different ridges can be provided by appropriately adjusting the biases. This approach can be extended to any number of ridges.

Thus, an exemplary embodiment of the invention is a composite detector having two or more detector elements, each detector element being a ridge in metallic slit detector as described above. Such detector elements can have different ridge widths, each ridge width providing a corresponding distinct peak response wavelength $\lambda_p$. Each detector element can be individually biased via its metal terminals. The sharing of electrodes by ridges (e.g., ridges 414 and 416 share electrode 406 on FIG. 4) does not interfere with this individual biasing. The composite detector output can be a sum of outputs of the detector elements (e.g., by summing the photocurrent due to each ridge). With this approach, the spectral response curve of the composite detector can be altered by changing the biasing the detector elements.

Practice of the invention does not depend critically on the materials employed. Section B below relates to a silicon detector fabricated on a silicon-on-insulator (SOI) wafer. Other experimental work we have performed relates to germanium epitaxially grown on silicon, and then transferred to a Pyrex substrate by anodic bonding. The resulting detectors had a germanium active region disposed on a Pyrex substrate. This approach can also be extended to Ge-on-insulator substrates fabricated in a CMOS (complementary metal oxide semiconductor) compatible process, or Ge epitaxially grown on SOI substrates. More generally, we define a 'semiconducting' material as any material capable of generating charge carriers in response to incident optical radiation (UV/visible/infrared). The present approach is applicable to any such semiconducting materials. Practice of the invention also does not depend critically on the composition of the metal terminals. Such metals can be selected for convenience in research demonstrations (e.g., gold) or for CMOS compatibility (e.g., aluminum or copper). The relevant property of the metal terminals is mainly that they act like normal mirrors. Details of the plasmon resonance, and the differences in these plasmon properties from metal to metal are often irrelevant, as described in greater detail below.

B) Experimental Demonstration

If we could fabricate multiple nanoscale photodetectors within one optical beam spot with separately engineered wavelength sensitivities, then we would enable many different applications. We could eliminate separate wavelength demultiplexing optics and photodetection units in optical communications or spectrometers, leading to compact on-chip spectroscopes for lab-on-a-chip systems, detectors for free space wavelength-division multiplexing (WDM) systems and multi-spectral imaging detectors. If detectors that respond to different wavelengths could all be fabricated lithographically on a single layer using a planar fabrication process, then such devices could leverage the CMOS fabrication platform. Here we propose and demonstrate a novel planar approach for fabricating tunable resonator-photodetector combinations where the center wavelength of the photodetector's response is controlled by a lateral dimension. This approach is also promising for designing efficient nanoscale photodetectors for short-haul data communications applications at 850 nm, a wavelength at which silicon is weakly absorbing.

The ability of metals to confine light at deeply subwavelength scales has long been used to realize many different kinds of antenna structures, waveguides and wavelength splitters for nanoscale photodetectors. Metals are also routinely used as contacts for high speed MSM (Metal-Semiconductor-Metal) photodetectors.

One key idea presented here is that the same metallic structure can be used simultaneously for light confinement, wavelength tuning, and carrier extraction. This additional functionality leads to devices that cannot be realized by purely dielectric structures. Designing resonators that can be tuned by a single lateral dimension leads to a planar single step fabrication process, reducing complexity and leading to low capacitance devices with potentially very high operating speeds. In addition, with the semiconductor industry moving towards 3D FINFET-like device architectures, our structures here can be fabricated on the same process platform and promise tight integration between transistors and photodetectors for next generation on-chip optical interconnects.

The simplest way to incorporate wavelength sensitivity, when shining light onto the top surface of a photodetector, is to add an optical filter such as a "vertical" Fabry-Perot resonator made from layers of dielectrics. To detect N wavelengths, however, we need to fabricate N filters of different thicknesses. Such fabrication requires (at least) N masking steps for the N subsequent etches or depositions to set the different filter thicknesses. This process becomes cumbersome with increasing N. One possible approach to designing resonators for multiple wavelengths in a single layer is to incorporate guided resonance filters, either as subwavelength gratings or photonic crystal slabs, which can be excited in such a surface-normal configuration. But the structure then typically has to be multiple wavelengths in size laterally and is not so attractive for dense integration.

FIG. 1A as described above shows an exemplary structure for the present approach. For the example of this section, 102 is a buried oxide layer of an SOI wafer, layer 104 and ridge 106 are silicon, and terminals 108 are gold. Two features of the structure have particular technical significance. The first feature is the resonance formed by the combination of metal terminals 108 and semiconducting ridge 106. This resonance has a relatively high Q compared to an equivalent structure with no metal terminals. The Q is boosted primarily because the reflectivity off the sidewalls is enhanced by the presence of the metallic surfaces; note that the Fresnel intensity reflection coefficient at 850 nm wavelength (at normal incidence) for a silicon-air interface is 0.33 whereas that of a silicon-gold interface is 0.93, so relatively much larger amounts of light would leak out of the side walls of a bare silicon ridge.

The second feature is the presence of semiconducting layer 104. Although it is possible to fabricate this structure with good optical contact between terminals 108 and ridge 106, we have found that electrical contact across these interfaces tends to be poor. Thus, the presence of layer 104 provide a path for current to flow that does not require current to flow across the interfaces between ridge 106 and terminals 108. Instead, current can flow vertically between terminals 108 and layer 104, and then laterally through ridge 108. Processes for providing a good electrical contact at a horizontal metal-semiconductor interface are known in the art, and are applicable to making contact between terminals 108 and layer 104.

Figure 5:
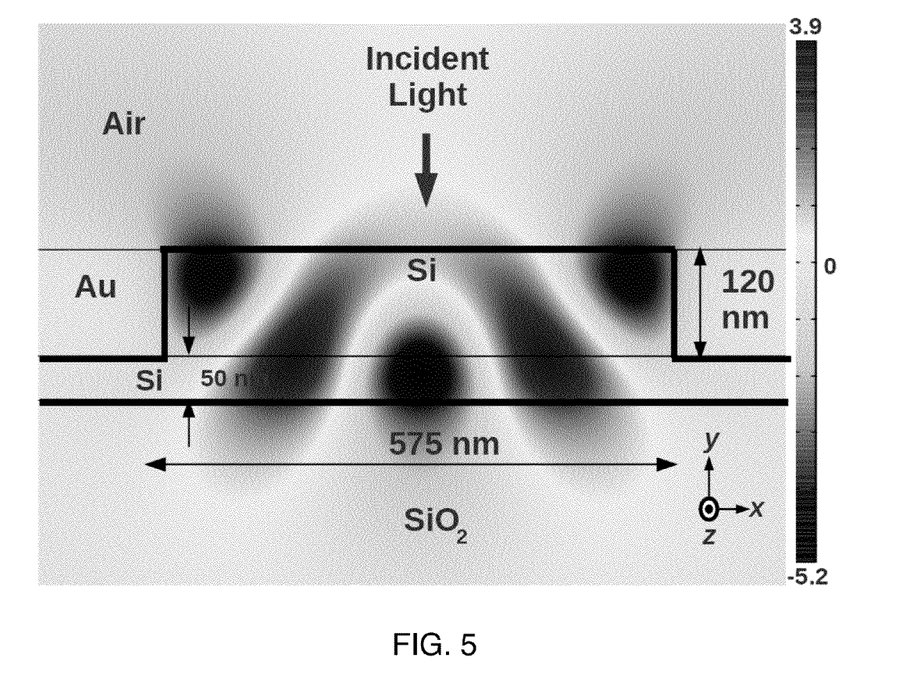
FIG. 5 shows a simulated mode profile relating to a dielectric resonance.

The composite structure can be thought of as a cavity coupled to two waveguides at the bottom. FIG. 5 shows the electric field ($E_z$) in the device under on-resonance plane wave excitation. The silicon base layer can act as a waveguide clad by oxide at the bottom and gold at the top. The coupling of light into these horizontal waveguides provides additional loss channels for the resonator, which can lower the Q factor but increase the absorption cross-section, and thus the responsivity, significantly. The guiding in the silicon base layer allows us the future possibility of engineering optical coupling between adjacent ridges; such optical coupling is promising for the design of devices with greater functionality, such as more sophisticated spectral response.

Given that we are shining light vertically onto the top surface, it might seem surprising that we are exciting a predominantly lateral Fabry-Perot resonance in the structure. We can better understand this by noting that there will be strong diffraction of light into silicon at highly oblique angles at the metal-silicon edges at the sides of the slits. This excites quasi-TEM waves in the silicon layer and a standing wave is set up in the cavity formed by the silicon ridge and the metallic slit, which acts as a pair of high reflectivity mirrors. Since the lateral features of the Fabry-Perot mode inside the high-index silicon ridge are much smaller than a half-wavelength in free space, there is little direct out-coupling of light through the silicon top surface, hence allowing a relatively high Q for the resonance.

When excited with polarization perpendicular to the slit ($H_z$), the structure also supports a plasmon resonance which can be thought of as the vertical Fabry-Perot resonance of the MIM (Metal-Insulator-Metal) mode formed by the gold slit and the silicon ridge, and we can observe this resonance experimentally. Unlike the dielectric resonance, which cuts off for small widths ($w<5\lambda/2n_{si}$), the plasmon resonance persists down towards zero width, but it is not so easily tuned by lateral dimensions.

Figure 6:
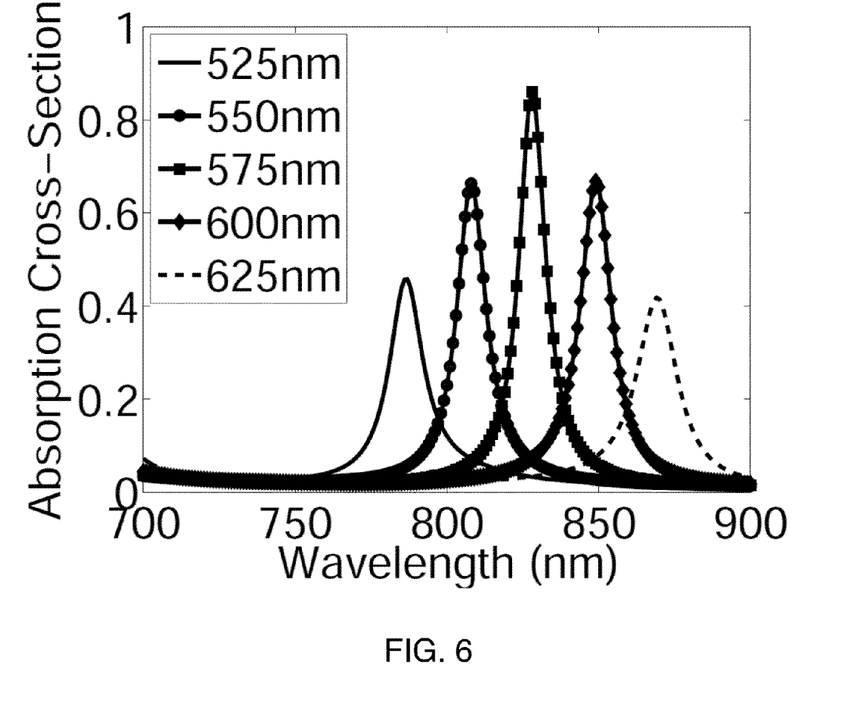
FIG. 6 shows simulated absorption cross section vs. wavelength for various ridge widths.

The resonant width w for a given wavelength $\lambda$ is roughly $w \sim 5\lambda/2n_{si}$. FIG. 6 shows the calculated absorption cross-section for devices with five different widths (525, 550 575, 600, and 625 nm respectively), showing a shift to longer wavelength with increasing ridge width as expected. For w=575 nm (central curve), the calculations show that nearly 90% of the light incident on the slit width (at the resonant wavelength near ~825 nm) is absorbed in the silicon ridge (thickness ~120 nm) and a depletion layer of 1 µm presumed width in the 50 nm thick silicon base region. This simulation shows that, in addition to controlling spectral response, this approach allows even this thin (170 nm) silicon layer to be an efficient photodetector at the ~800 nm wavelength operating region of many short-distance optical links, a region where bare silicon has an absorption length of ~10 µm. Such an approach is particularly promising for high-efficiency low-capacitance photodetectors completely compatible with silicon CMOS processing on, for example, SOI wafers.

These simulations were performed using the RF module of the commercial finite element method solver COMSOL. The structures were excited by a plane wave with appropriate polarization ($E_z$ or $H_z$) and the absorbed power was measured in a region defined by the silicon ridge and a 1 μm wide silicon base region (an appropriate width given the possible depletion width for efficient photocarrier collection with the voltage bias used in our experiments). The refractive index values for silicon and gold were taken from the literature. The absorption cross-section was calculated as the ratio of the aforementioned absorbed power to the power incident on the exposed top surface of the silicon ridge. The cross-section is plotted as a fraction of the ridge width.

Figure 7:
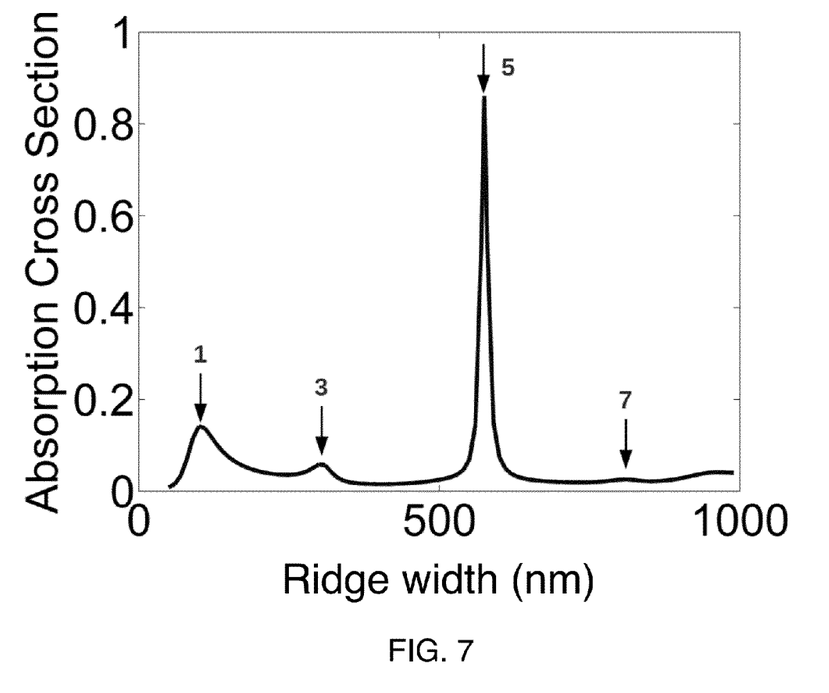
FIG. 7 shows simulated absorption cross section vs. ridge width at a fixed wavelength.

The above-described structure supports resonances at integral multiples of half-wavelength ($\lambda/2n_{si}$, $3\lambda/2n_{si}$ and so on). The reason we chose the $5\lambda/2n_{si}$ resonance to work with is that it gives us the sharpest resonance with maximum absorption cross-section (which is important for designing these resonator photodetector structures) while remaining below a free-space wavelength (which is crucial for dense integration). FIG. 7 shows the simulated absorption cross-section (as a fraction of ridge width) plotted against ridge width, for a free-space wavelength $\lambda$=850 nm. The plot indicates the ridge widths corresponding to the first four lateral resonances of the structure, clearly showing that the $5\lambda/2$ resonance has the highest absorption cross-section.

Figure 8:
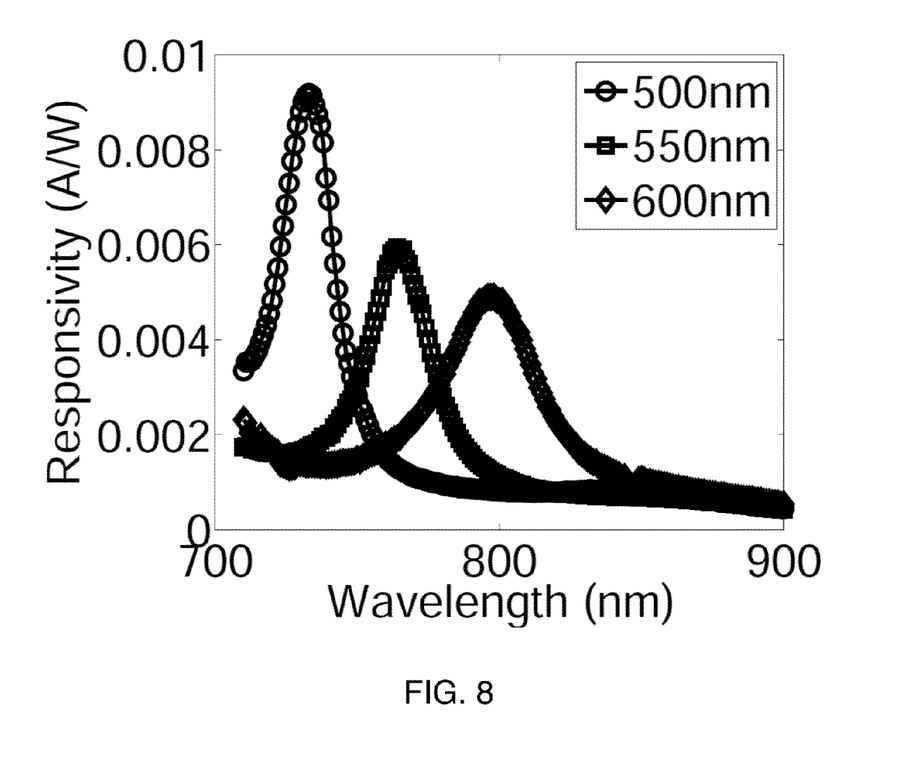
FIG. 8 shows measured experimental results for responsivity vs. wavelength for several different ridge widths.

FIG. 8 shows the measured absorption spectra for devices with three different ridge widths (500, 550 and 600 nm respectively) when excited with polarization parallel to the slit ($E_z$). The spectra show the same trends as the simulations of FIG. 6, which simulated the absorption in these devices. The reasonable agreement between simulation and measurement gives us confidence that these structures can be predictably designed for more complex responses. The low A/W numbers can be understood based on the fact that the focused beam spot has a diameter ~7.5 μm whereas the device width is ~600 nm and so the fraction of the beam that is intercepted by the device is low. It is also difficult to estimate experimentally how large the effective depletion region is in the silicon base layer in such a structure, so collection efficiency may be less than for the ~1 micron depletion width assumed in simulations. We also observed the plasmon resonance when the device was excited with polarization perpendicular to the slit ($H_z$).

To perform these measurements, light from a tunable Ti-Sapphire laser (Spectra-Physics MaiTai, mode-locked with pulse spectral width of ~6 nm at 800 nm) was attenuated, chopped, spatially filtered and then focused on the sample using a Mitutoyo Achromat Objective (20×, NIR). The polarization was controlled using a Glan-Laser polarizer and a broadband halfwave plate (Fresnel Rhomb). The sample was biased (voltage ~250 mV) using a parameter analyzer and the photocurrent was detected by a lock-in amplifier which was phase locked to the reference from the chopper. The normalization spectrum is measured at the location of the sample using a power meter (Thor Labs PM 700). The photocurrent spectra are plotted in (A/W).

Figure 9:
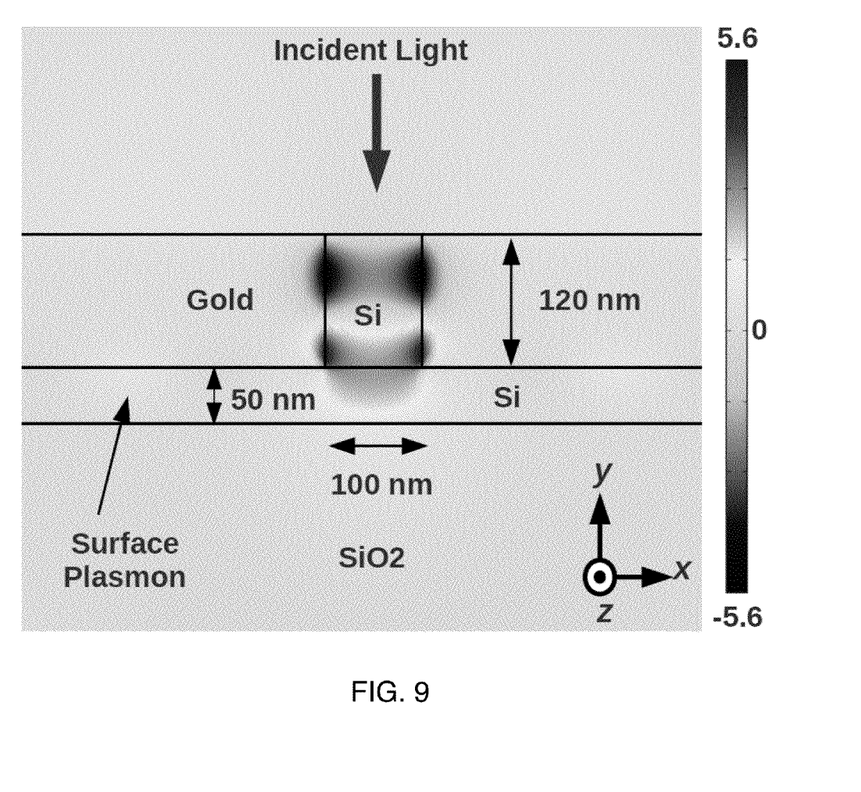
FIG. 9 shows a simulated mode profile relating to a plasmon resonance.

The resonance supported by the structure when excited with E field polarized parallel to the slit (i.e., polarization $E_z$) is of purely dielectric origin, with the metal serving to enhance the Q of the structure by enhancing sidewall reflectivity and blocking direct absorption in the silicon base. When excited with polarization perpendicular to the slit ($H_z$), the structure also supports a plasmon resonance which can be thought of as the vertical Fabry-Perot resonance of the MIM (Metal-Insulator-Metal) guided mode formed by the gold slit and the silicon ridge. FIG. 9 shows the field distribution ($H_z$) when the structure is excited by a plane wave in this polarization ($H_z$). The responsivity of the structure is enhanced further by the excitation of surface plasmons at the bottom gold-silicon interface. As opposed to the dielectric resonance, the plasmon resonance is primarily confined near the two metal-semiconductor interfaces. Thus, for this resonance it is important that the metal is in direct conformal contact with the silicon ridge sidewalls since the presence of any air gap between the metal and the silicon tends to eliminate strong surface plasmon effects. An important distinction between the dielectric and plasmon resonances is that the dielectric resonance exhibits a cut-off (for the resonance of primary interest here, roughly when the width $w<5\lambda/2n_{si}$) whereas the metallic resonance persists down to zero ridge width.

The dependence of the plasmon resonance on width is more complicated given that the mode index and the phase pickup on reflection at the two (top and bottom) ends (air-MIM and silicon-MIM) are functions of both ridge width and wavelength. We resort to numerical simulations to study the tuning of the absorption resonance with ridge width. Simulations show that the metallic resonance exhibits lower Q and its dependence on width can be observed when the width is much less than the wavelength, but beyond a certain width, the spectra stop shifting with width. This can be attributed to the gradual decoupling of the MIM mode into two weakly coupled surface plasmons at the silicon-gold interfaces. While the resonance persists down to zero gap width, the Q decreases with width because a greater fraction of the energy resides in the metal where it is dissipated by ohmic losses.

Figure 10:
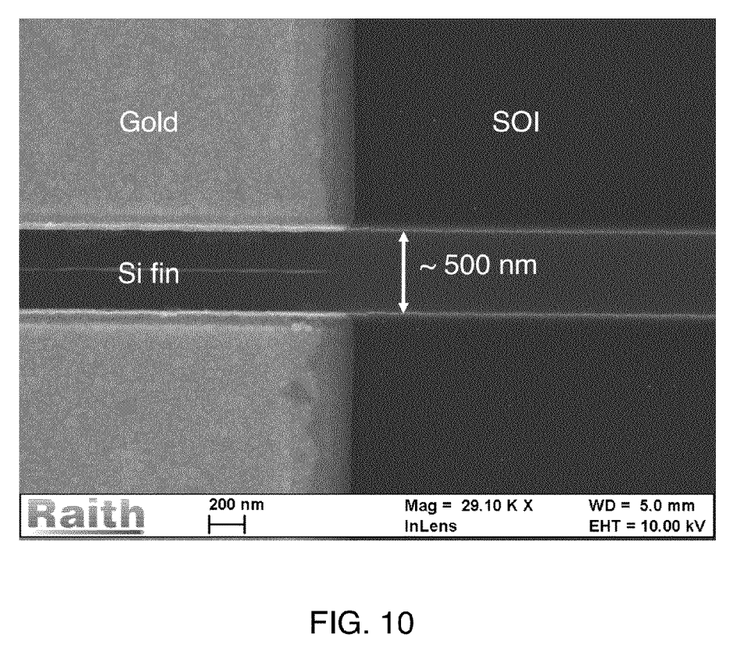
FIG. 10 is a scanning electron microscope (SEM) image of an exemplary experimental device.

FIG. 10 shows an SEM image of a representative experimental device. The fabrication sequence of FIGS. 3A-E was used in this work. The process starts with a silicon-on-insulator (SOI) wafer, which is oxidized and thinned to get the desired silicon device layer thickness. The top thermal oxide is used as a hard mask for patterning the silicon ridge using electron-beam lithography and dry etching (Reactive Ion Etching {RIE} using $CHF_3/O_2$ chemistry). The silicon ridge thickness is controlled by measuring the silicon base thickness using ellipsometry (silicon device layer thickness=ridge thickness+base thickness). Cr/Au contacts are then evaporated. The metal thickness is measured in-situ and is controlled to match the thickness of the silicon ridge. The hard mask is then lifted off using BOE (Buffered Oxide Etch) to leave the silicon ridge self-aligned to the metallic slit.

In summary, we have demonstrated a novel self-aligned fabrication procedure for silicon ridges inside metallic slits and have shown that this structure supports strong absorption resonances in polarizations parallel to and perpendicular to the slit. Additionally, we have demonstrated controlled tuning of the resonance by varying the width of the ridge, allowing devices of different spectral sensitivity in a single planar process strongly compatible with CMOS processing, and permitting efficient photodetectors in thin Si structures even in spectral regions of weak Si optical absorption. We believe that these devices represent a significant step towards the development of compact on-chip spectroscopes, imaging systems and detectors for on-chip optical interconnects.

The invention claimed is:

1. A photodetector comprising:
   an insulating substrate;
   a semiconducting layer disposed on the insulating substrate;
   a semiconducting ridge disposed on the layer;
   two metal terminals disposed on the semiconducting layer and also disposed to laterally sandwich the semiconducting ridge, wherein the semiconducting ridge has a ridge width separating the metal terminals;

wherein optical illumination of the semiconducting ridge provides an electrical detector response at the two metallic terminals;

wherein a free space wavelength of peak detector response $\lambda_p$ is determined by the ridge width.

2. The photodetector of claim 1, wherein the ridge width is less than the free space wavelength of peak detector response.

3. The photodetector of claim 1, wherein the semiconducting ridge has an index of refraction $n_s$ at $\lambda_p$, and wherein the ridge width is about 2.5 $\lambda_p/n_s$.

4. The photodetector of claim 1, wherein the photodetector is configured to detect optical radiation incident on the semiconducting ridge and propagating toward the substrate.

5. The photodetector of claim 4, wherein the optical radiation is polarized parallel to the semiconducting ridge.

6. The photodetector of claim 4, wherein the optical radiation is polarized perpendicular to the semiconducting ridge.

7. A detector comprising:
two or more detector elements, each detector element being a photodetector as recited in claim 1.

8. The detector of claim 7, wherein each of the detector elements has a distinct $\lambda_p$ determined by its corresponding ridge width.

9. The detector of claim 8, wherein each of the detector elements is individually biased via its metal terminals, and wherein a detector output is a sum of outputs of the detector elements, whereby a spectral response curve of the detector can be adjusted by altering biasing of the detector elements.

10. The photodetector of claim 1, wherein the electrical detector response is a photoconductive detector response.

11. The photodetector of claim 1, wherein the electrical detector response is a photovoltaic detector response.

12. The photodetector of claim 1, wherein the semiconducting layer and the semiconducting ridge have the same composition.

13. A photodetector comprising:
an insulating substrate;
a semiconducting on the insulating substrate;
a semiconducting ridge disposed on the layer;
two metal terminals disposed on the semiconducting layer and also disposed to laterally sandwich the semiconducting ridge, wherein the semiconducting ridge has a ridge width separating the metal terminals;
wherein optical illumination of the semiconducting ridge provides an electrical detector response at the two metallic terminals;
wherein the semiconducting layer includes a p-doped region and an n-doped region.

14. The photodetector of claim 13, wherein the p-doped region and the n-doped region laterally sandwich an intrinsic region in the semiconducting layer.

* * * * *